United States Patent [19]
Khesin et al.

[11] Patent Number: 4,785,256
[45] Date of Patent: Nov. 15, 1988

[54] NON-LINEAR AMPLIFIER

[75] Inventors: Mark J. Khesin, Nepean; Boris Livshits, Ottawa, both of Canada

[73] Assignee: Combustion Engineering, Inc., Windsor, Conn.

[21] Appl. No.: 106,530

[22] Filed: Oct. 9, 1987

[51] Int. Cl.$^4$ .............................................. H03F 1/36
[52] U.S. Cl. ..................................... 330/110; 330/293
[58] Field of Search ............... 330/252, 259, 260, 291, 330/293, 294, 110

[56] References Cited
U.S. PATENT DOCUMENTS
4,069,459  1/1978  Lee ....................................... 330/110

Primary Examiner—Gene Wan
Attorney, Agent, or Firm—Chilton, Alix & Van Kirk

[57] ABSTRACT

An amplifier having at least a pair of gain levels for each of the AC and DC components of an input signal. The non-linearity in gain is achieved through the use of feedback which varies, in stepwise fashion, with input sigal magnitude.

7 Claims, 2 Drawing Sheets

NON-LINEAR AMPLIFIER

BACKGROUND OF THE INVENTION

(1) Field of the Invention

The present invention relates to the amplification, with different pre-selected degrees of non-linearity, of the alternating and direct current components of a single input signal and particularly to differently amplifying the steady-state and varying components of a signal commensurate with the intensity of a monitored flame. More specifically, this invention is directed to a non-linear amplifier which exhibits different non-linearity for DC and AC components of an input signal commensurate with the intensity of a monitored flame and especially to a flame scanner which employs such amplifier. Accordingly, the general objects of the present invention are to provide novel and improved methods and apparatus of such character.

(2) Description of the Prior Art

While not limited thereto in its utility, the present invention is particularly well suited for use in a flame scanning system of a type employed to monitor the state of a burner in a fossil fuel fired furnace. Flame scanners are well known in the art and typically include a scanner head which comprises an optical flame sensing device such as a photocell. The photocell will provide a low level signal commensurate with the instantaneous intensity of the monitored flame. This low level signal, which has alternating (AC) and steady state (DC) components, is pre-amplified, to improve the signal-to-noise ratio thereof, and thereafter transmitted, typically by a cable, to signal processing electronics which provides visual and/or audible outputs commensurate with the state of the monitored flame. The scanner may include a light conductor, such as a fiber optic bundle, which is inserted into the furnace for the purpose of coupling the light resulting from the combustion of fuel in the region being monitored to the photocell.

In order to derive the desired information commensurate with flame state from the electrical signal produced by the photocell or other light responsive sensor, the signal transmitted to the processing electronics must have a high signal-to-noise ratio. This is particularly important since the AC component of the sensor output signal will typically be no higher than a few percent of the DC component. Also, the AC signal component must be amplified to a level where a signal which is reliably detectable will be present while, at the same time, the DC component of the sensor output signal must be limited to a level which will not saturate the processing electronics. In the prior art, in an attempt to address these conflicting signal component pre-processing requirements, it has been conventional practice to attempt to separate the AC and DC components of the sensor generated signal and then amplify the AC component after it has been separated from the DC component. Such separation prior to amplification has resulted in flame scanners which were comparatively complex and, of course, circuit complexity is to some degree inversely related to reliability.

For a general discussion of flame scanners of the general type to which the present invention relates, reference may be had to the "BACKGROUND OF THE INVENTION" portion of U.S. Pat. No. 4,322,723 which is assigned to the assignee of the present invention.

SUMMARY OF THE INVENTION

The present invention overcomes the above briefly-discussed and other deficiencies and disadvantages of the prior art by providing a novel amplifier, particularly well suited for use in a flame scanner, which has different amplification characteristics for the DC and AC components of an input signal. Whem embodied in a flame scanner, the present invention guarantees protection against saturation while insuring maximum sensitivity of the AC signal component with maximum signal-to-noise ratio in a transmission line between the amplifier and remote signal processing equipment.

The foregoing attributes are accomplished in an uncomplicated and reliable manner and apparatus in accordance with the present invention is characterized by ease of adjustability to take into account, in the case of a flame scanner implementation, different flame conditions and system safety requirements, different types of fuel, different types of light responsive sensors and various scanner positioning. Thus, apparatus accordance with the present invention has, in addition to its increased reliability, enhanced flexibility when compared to the prior art.

In accordance with a preferred embodiment, a non-linear amplifier for use in the practice of the present invention is characterized by DC output which varies linearly with the magnitude of the DC component of the input signal but at plural levels of gain, i.e., there is at least one break point in the plot of DC signal gain. Simultaneously, the AC output of the amplifier varies non-linearly and, at the same break point, the amplifier exhibits an increase in AC signal gain. The foregoing is accomplished, in the least complicated implementation, through the use of a single diode-resistor-capacitor feedback network with the conduction point of the diode defining the transition point between greater and lesser DC gain and lesser and greater AC gain.

BRIEF DESCRIPTION OF THE DRAWING

The present invention may be better understood and its numerous objects and advantageous will become apparent to those skilled in the art by reference to the accompanying drawing wherein.

DESCRIPTION OF THE DISCLOSED EMBODIMENT

Figure 1:
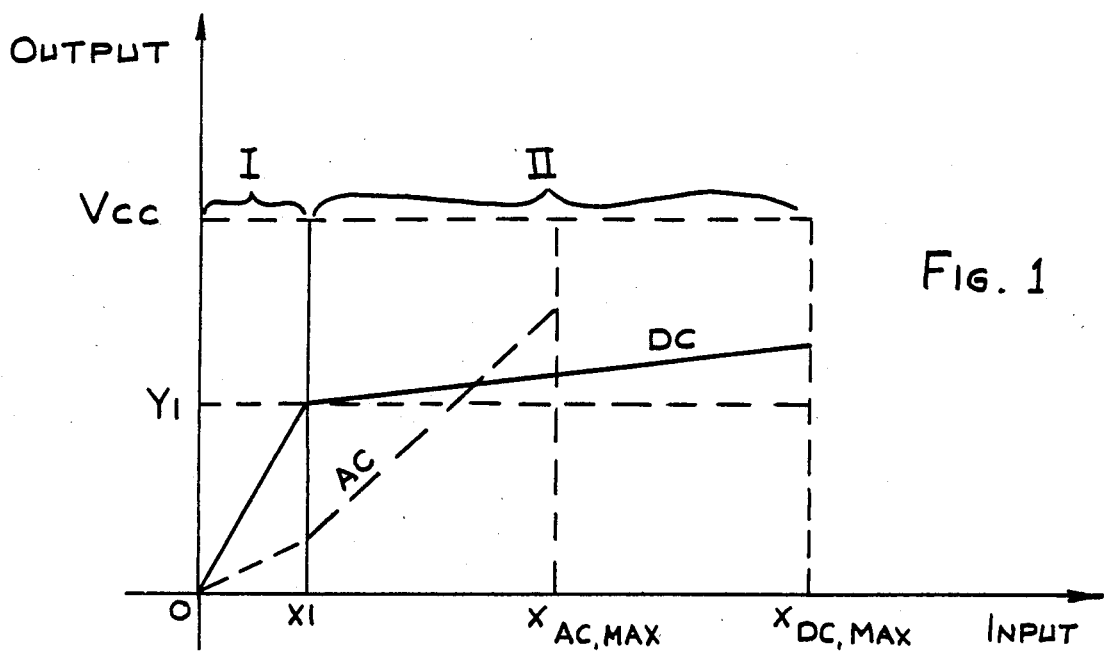
FIG. 1 is a plot of output signal magnitude vs. input signal level, i.e., a diagram of gain, for an amplifier in accordance with a first embodiment of the present invention.

The present invention will be described, with reference to the drawing, in the context of the pre-amplification of the output signal of a light responsive sensor in a flame scanner. The invention, as depicted in FIG. 2, is embodied in a single stage amplifier which provides different non-linear characteristics for DC and AC components of an input signal commensurate with a flame being monitored by a photocell, the magnitude of the input signal applied to the amplifier being represented by the abscissa in FIG. 1.

Figure 2:
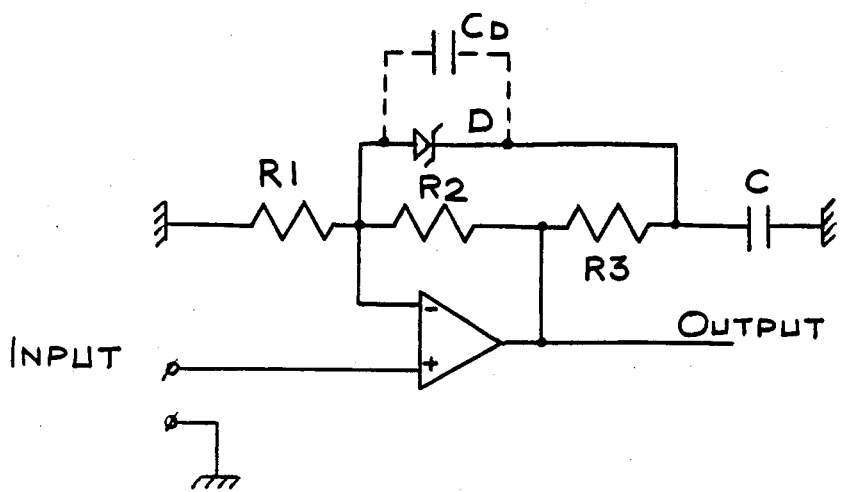
FIG. 2 is a schematic diagram of an amplifier in accordance with the present invention characterized by non-linear AC and DC gate as depicted in FIG. 1.

Continuing to refer to FIG. 1, it may be seen that the amplifier circuit of FIG. 2 is characterized by a relatively high but constant DC gain in input signal range I between zero or "no flame" and $X_1$ which represents the unstable flame condition. In input signal range II, when the input signal varies between level $X_1$ and the maximum level $X_{DC}$, max, the DC gain of the amplifier is also constant but reduced for that portion of the DC component of the input signal in excess of $X_1$. The amplifier non-linearity which results in the substantially reduced gain in the input signal range commensurate with the presence of a flame insures that the DC output signal magnitude will not approach the saturation level as determined by the $V_{cc}$ of the circuit components.

The AC component of the amplifier output signal also varies non-linearly and is characterized by a first or lower gain below input signal level $X_1$ and a higher gain for the portion of the AC component above input signal level $X_1$. This non-liner characteristic of the amplifier insures high sensitivity and signal-to-noise ratio in the region of interest, i.e., when a flame is predictably present and being monitored.

Referring now to FIG. 2, an amplifier in accordance with the present invention is characterized by a feedback network, coupled between the amplifier output terminal and the negative or inverting input terminal, consisting of resistors $R_1$, $R_2$ and $R_3$, capacitor C and Zener diode D. In input signal range I, diode D will be non-conducting and the amplifier will provide a linear DC output with a gain approximately determined by the ratio of $R_2$ to $R_1$. In area II, the diode D will conduct and the DC gain will be approximately determined by the ratio $R3/R1$ provided that the value of resistor $R_2$ is much greater than that of resistor $R_3$.

The characteristics of AC output signal can be explained as follows. Basically, the AC component of the input signal is amplified with a gain determined approximately by the ratio $R_2/R_1$ in all ranges of input signal (I and II) since the circuit ($R_3$-C) will prevent the feedback of AC signal through diode D. However, Zener diode D has some internal capacitance, $C_D$, which varies invesely with the voltage applied to the diode, i.e.

$$C_D = f \frac{1}{V_{Output}}.$$

When the output signal is low, i.e., in input signal range I, this $C_D$ is relatively high and represents a relatively low impedance for AC current through diode D. This circuit, i.e., resistor $R_3$ connected in series with diode D and the series combination connected in parallel to resistor $R_2$, reduces somewhat the overall feedback circuit impedance, thus increasing the negative feedback of the AC signal and thereby reducing the AC gain in input signal range I. With the increase of the output signal and especially when the input signal exceeds $X_1$, i.e., in input signal range II, the value of capacitance $C_D$, goes down nd impedance for the AC current through diode D increases, thus reducing the feedback of the AC signal through diode D and increasing the AC gain.

This explanation can be considered only as a guideline for understanding. In reality, above-described circuit represents a complex non-linear system, and its operation depends on real component values and their ratio, particularly $R_2/R_1$, $R_3/R_2$, $(C_D$-$R_3)/R_2$, and $C_D/C$.

Figure 3:
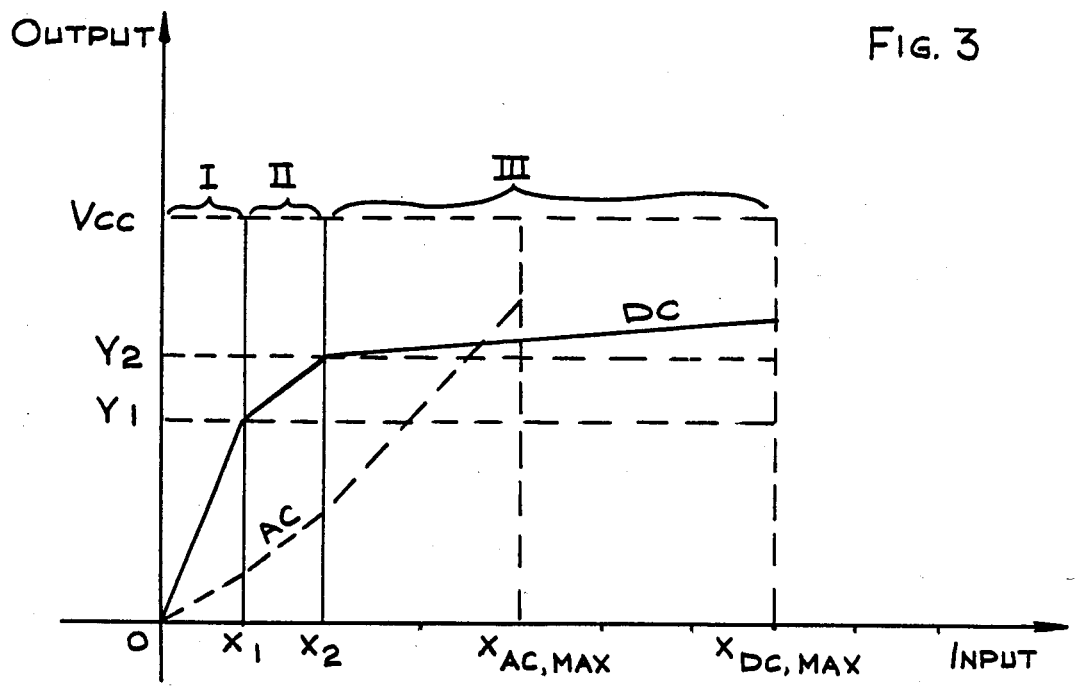
FIG. 3 is a graphical representation similar to FIG. 1 for an amplifier having three separate levels of AC and DC gain.

Referring to FIG. 3, it should now be obvious to those skilled in the art that an amplifier in accordance with the present invention could be provided with multiple gain break-points or transitions by adding feedback circuits similar to that depicted in FIG. 2 in parallel with the FIG. 2 feedback circuit, each feedback circuit employing a different Zener diode and different component values. Thus, referring to FIG. 3 as an example of a flame scanner implementation, the area I could be commensurate with the "no flame" condition, the area II could be commensurate with the "marginal" or "unstable" flame condition and the area III could be commensurate with a "stable" flame condition.

It will also be obvious to those skilled in the art that the values of the diode D and the passive circuit components may be varied to take into account the type of fuel and other parameters of the installation.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. Apparatus for the amplification of electrical input signals having both steady state and alternating components, the apparatus having at least two different levels of gain for each of steady state and alternating signals, the transition between the gain levels for both steady state and alternating signal components being at the same average input signal magnitude, said apparatus comprising:

amplifier means, said amplifier means including an amplifier and having inverting and non-inverting input signal terminals and an output terminal;

means for applying an input signal having steady state and alternating components between a first of said amplifier means input terminals and a reference potential; and non-linear feedback circuit means connected between said amplifier means output terminal and the other of said input terminals, said feedback circuit means including:

voltage divider means, a first point of said voltage divider means being connected to said reference potential, a second point of said voltage divider means being connected to said amplifier means other input terminal, a third point of said voltage divider means being connected to said amplifier means output terminal;

a capacitance connected between a fourth point on said voltage divider means and the reference potential; and voltage sensitive switch means connected between said amplifier means other input terminal and said fourth point on said voltage divider means, said switch means having an internal capacitance, said switch means being in parallel with the portion of said voltage divider means between said second and fourth points and including said third point.

2. The apparatus of claim 1 wherein said amplifier means first input terminal is the non-inverting signal terminal.

3. The apparatus of claim 1 wherein said switch means comprises a solid state device having an internal capacitance which varies inversely with applied voltage.

4. The apparatus of claim 2 wherein said switch means comprises a solid-state device having an internal capacitance which varies inversely with applied voltage.

5. The apparatus of claim 3 wherein said solid state device is a Xener diode.

6. The apparatus of claim 4 wherein said solid state device is a Xener diode.

7. The apparatus of claim 6 wherein said amplifier means comprises an operational amplifier.

* * * * *